United States Patent [19]

Yoshida et al.

[11] Patent Number: 5,532,542
[45] Date of Patent: Jul. 2, 1996

[54] ENERGY-TRAP CHIP-TYPE PIEZOELECTRIC RESONANCE COMPONENT

[75] Inventors: Ryuhei Yoshida; Masaya Wajima, both of Nagaokakyo, Japan

[73] Assignee: Murata Manufacturing Co., Ltd., Japan

[21] Appl. No.: 387,200

[22] Filed: Feb. 13, 1995

[30] Foreign Application Priority Data

Feb. 16, 1994 [JP] Japan ................................ 6-019648

[51] Int. Cl.$^6$ .......................... H03H 9/02; H01L 41/08
[52] U.S. Cl. ........................ 310/348; 310/344; 310/321; 310/333; 310/365
[58] Field of Search ................................ 310/321, 333, 310/344, 348, 365

[56] References Cited

U.S. PATENT DOCUMENTS

| | | | |
|---|---|---|---|
| 4,293,986 | 10/1981 | Kobayashi et al. | 310/344 |
| 4,666,547 | 5/1987 | Snowden et al. | 159/280 |
| 4,779,020 | 10/1988 | Konno et al. | 310/334 |
| 5,218,259 | 6/1993 | Dam et al. | 310/344 |
| 5,357,662 | 10/1994 | Takagi et al. | 310/365 |
| 5,442,251 | 8/1995 | Kaidu et al. | 310/34 |

FOREIGN PATENT DOCUMENTS

| | | | |
|---|---|---|---|
| 0139514 | 8/1983 | Japan | 310/344 |
| 0166608 | 7/1987 | Japan | 310/348 |
| 0175512 | 7/1988 | Japan | 310/344 |
| 0397313 | 4/1991 | Japan | 310/344 |
| 0097312 | 4/1991 | Japan | 310/344 |
| 0210809 | 9/1991 | Japan | 310/344 |
| 0247010 | 11/1991 | Japan | 310/344 |

*Primary Examiner*—Thomas M. Dougherty
*Attorney, Agent, or Firm*—Ostrolenk, Faber, Gerb & Soffen

[57] ABSTRACT

An energy-trap chip-type piezoelectric resonance component has a resonance part defined by first and second resonance electrodes which are formed on a pair of opposite surfaces of a piezoelectric plate so that vibrational energy of the resonance part is partially trapped, and first and second holding plates which are bonded to both sides of the pair of opposite surfaces through adhesive layers, and the adhesive layers are applied onto regions other than that provided with the resonance part for allowing vibration of the resonance part, while the same contain granular solids.

30 Claims, 6 Drawing Sheets

ENERGY-TRAP CHIP-TYPE PIEZOELECTRIC RESONANCE COMPONENT

BACKGROUND OF THE INVENTION

1. Field of the Invention

The present invention relates to an energy-trap chip-type piezoelectric resonance component including an improved piezoelectric resonance element and a holding structure therefor.

2. Description of the Background Art

FIG. 1 is a perspective view showing an example of a conventional energy-trap piezoelectric resonance element 1. This piezoelectric resonance element 1 is formed by a rectangular piezoelectric plate 2 which is polarized along arrow P. First and second resonance electrodes 3 and 4 are formed on both major surfaces of the piezoelectric plate 2, to be opposed to each other on a central region of the piezoelectric plate 2. The first resonance electrode 3 extends from the central region to an end of the piezoelectric plate 2 on its upper surface. On the other hand, the second resonance electrode 4 extends from the central region to another end of the piezoelectric plate 2 on its lower surface.

In the piezoelectric resonance element 1, overlapping portions of the first and second resonance electrodes 3 and 4 define an energy-trap resonance part. When an ac voltage is applied across the first and second resonance electrodes 3 and 4, the resonance part is excited in a shear mode so that vibrational energy is trapped therein.

As a chip-type electronic component employing the aforementioned piezoelectric resonance element 1, FIG. 2 shows a known structure which is obtained by bonding protective substrates 5 and 6 on upper and lower portions of the piezoelectric resonance element 1 with adhesives. The protective substrates 5 and 6 have substantially U-shaped side elevational, shapes respectively, to provide spaces for allowing vibration of the resonance part within the cavities 5a and 6a.

In the structure shown in FIG. 2, it is necessary to prepare the protective substrates 5 and 6 having the cavities 5a and 6a, in order to provide the spaces for allowing vibration of the vibrating part of the piezoelectric resonance element 1. Namely, it is necessary to prepare not flat plate type protective substrates but the protective substrates 5 and 6 which are provided with the cavities 5a and 6a. Thus, the cost for the protective substrates 5 and 6 is increased, and working such as molding is complicated.

On the other hand, it is conceivable to apply adhesives onto upper and lower portions of the piezoelectric resonance element 1 in thicknesses allowing vibration of the vibrating part, for bonding flat plate type protective substrates thereto.

However, it is extremely difficult to reliably define spaces for allowing vibration of the resonance part by adhesives. In order to apply adhesives to the upper and lower surfaces of the piezoelectric resonance element 1 except the vibrating part for bonding the flat plate type protective substrates, for example, it is necessary to apply a certain degree of pressure. Due to this pressure, however, the adhesives may flow out toward the resonance part or onto side surfaces, to excessively reduce the thicknesses of the adhesive layers.

There has also been developed a method of employing double-fluid epoxy adhesives or the like and temporarily hardening the same for ensuring thicknesses of adhesive layers, for thereafter bonding flat plate type protective substrates. In this case, however, a long time is required for the adhesion since it is necessary to temporarily harden the adhesives, while it is extremely difficult to control the thicknesses of the adhesive layers with this method.

SUMMARY OF THE INVENTION

An object of the present invention is to provide a chip-type piezoelectric resonance component comprising a structure capable of reliably defining spaces for allowing vibration of a vibrating part of an energy-trap piezoelectric resonance element by adhesive layers, at a low cost.

The present invention is directed to an energy-trap chip-type piezoelectric resonance component comprising an energy-trap piezoelectric resonance element having a piezoelectric body and first and second resonance electrodes which are formed on a pair of opposite surfaces of the piezoelectric body for partially trapping vibrational energy of a resonance part, first and second holding plates which are arranged to hold the piezoelectric resonance element from both major surfaces thereof, and adhesive layers bonding the piezoelectric resonance element with the first and second holding plates in regions other than the resonance part for allowing vibration of the resonance part and integrating the piezoelectric resonance element with the first and second holding plates, and the adhesive layers contain granular solids.

According to the present invention, the granular solids contained in the adhesive layers can be prepared from an inorganic material such as metal powder or ceramic powder or other proper materials, and are not restricted in particular. In order to ensure thicknesses of the adhesive layers, the granular solids preferably have grain sizes of 3 to 10 μm.

According to the present invention, further, the adhesive for forming the adhesive layers containing the granular solids can also be prepared from an arbitrary adhesive and is not restricted in particular, while the adhesive can also be prepared from an epoxy resin-based adhesive or a silicone-based adhesive and it is possible to simplify the working step by preferably employing a single-fluid adhesive.

The energy-trap piezoelectric resonance element employed in the present invention is not restricted to the aforementioned one utilizing a thickness shear mode, but may be formed by that utilizing a thickness expansion mode or the like, with no particular restriction.

In the inventive energy-trap piezoelectric resonance component, spaces for allowing vibration of the vibrating part are defined between the piezoelectric resonance element and the first and second holding plates by the adhesive layers. Therefore, the first and second holding plates can be formed by flat holding plates having no cavities, thereby reducing the cost and simplifying the step for preparing the holding plates.

Even if the bonded portions are pressurized in bonding, it is possible to ensure the adhesive layers have desired thicknesses due to the granular solids. Thus, it is possible to accurately define the spaces for allowing vibration of the resonance part by the adhesive layers in high accuracy.

Further, the piezoelectric resonance element is reinforced by the first and second holding plates which are bonded thereto by the adhesive layers, whereby the thickness of the piezoelectric plate can be reduced as compared with the prior art and it is possible to provide a piezo-resonator which can be applied to use in a higher frequency range with no reduction in mechanical strength.

In addition, the vibration spaces around the resonance part are ensured by the adhesive layers, whereby it is possible to define proper vibration spaces in a piezo-resonator which is employed at various frequencies by simply changing regions for applying the adhesive layers.

In accordance with a particular aspect of the present invention, there is provided a chip-type piezoelectric resonance component including a pair of opposite surfaces of the piezoelectric body located on a pair of side surfaces of the piezoelectric body, the first and second resonance electrodes being formed on said pair of the, surfaces respectively, the chip-type piezoelectric resonance component further comprising, third and fourth holding substrates being stacked on upper and lower surfaces of a bonded structure of the first and second holding plates and the piezoelectric resonance element, and second adhesive layers for bonding the third and fourth holding plates to upper and lower portions of the bonded structure of the piezoelectric resonance element and the first and second holding plates. Since the third and fourth holding plates are arranged as described above, a resonance portion is enclosed in the structure formed by the first, second, third and fourth plates. Accordingly, a chip-type piezoelectric resonator having a high reliability can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Nonrestrictive embodiments of the present invention are now described to clarify the present invention.

Figure 3:
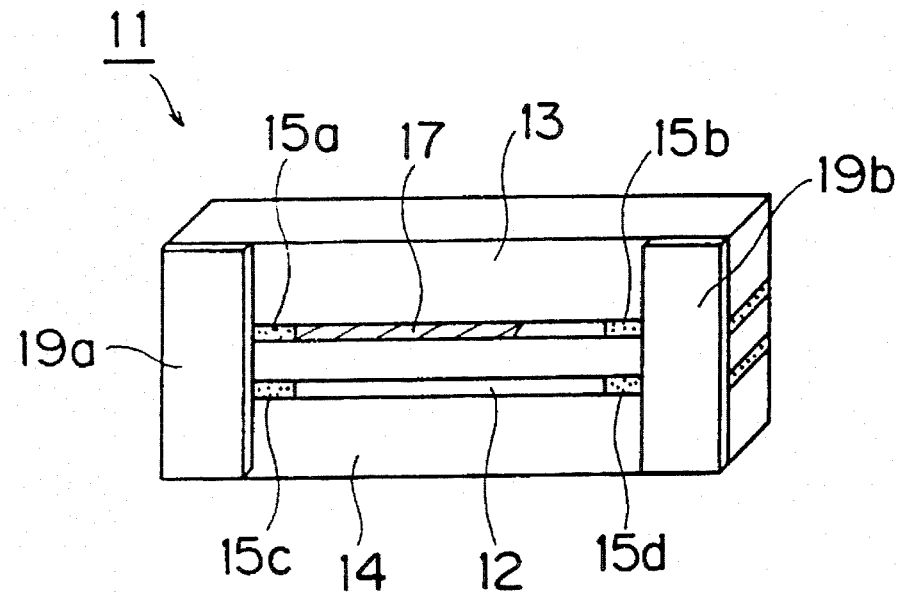
FIG. 3 is a perspective view showing an energy-trap piezo-resonator according to a first embodiment of the present invention.
Figure 4:
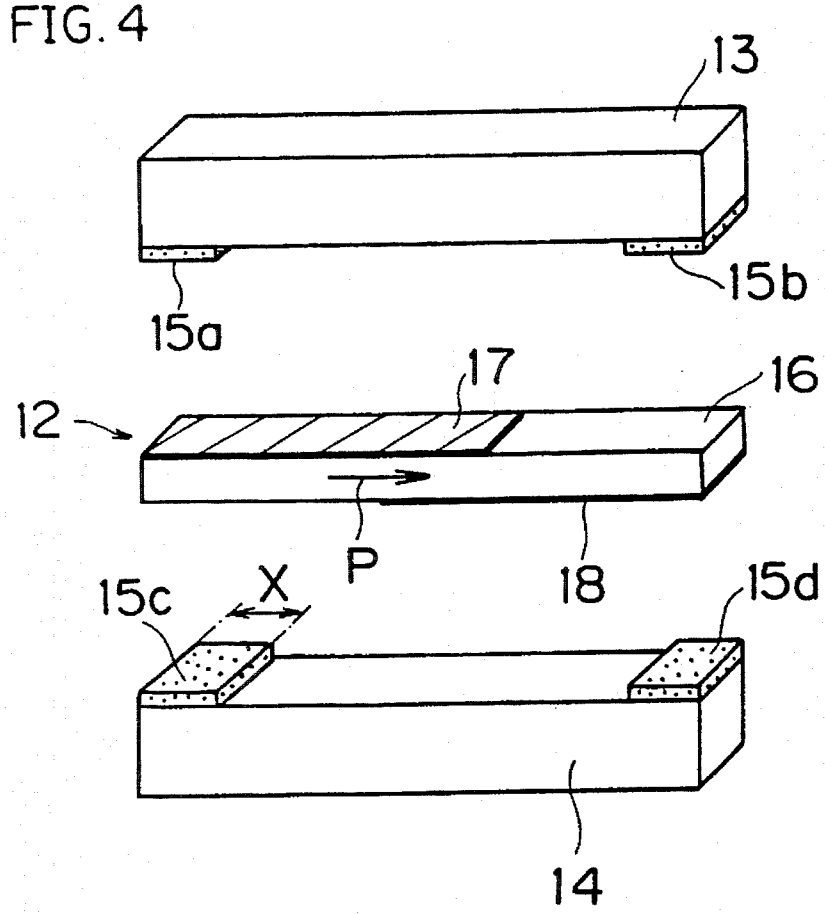
FIG. 4 is an exploded perspective view showing a principal part of the energy-trap piezo-resonator shown in FIG. 3.

FIG. 3 is a perspective view showing a chip-type energy-trap piezo-resonator 11 according to a first embodiment of the present invention, and FIG. 4 is an exploded perspective view showing a principal part thereof.

The energy-trap piezo-resonator 11 has such a structure that first and second holding plates 13 and 14 are bonded to both major surfaces of a piezoelectric resonance element 12 by adhesive layers 15a to 15d.

As shown in FIG. 4, the piezoelectric resonance element 12 has a rectangular piezoelectric plate 16 which is made of a piezoelectric material such as piezoelectric ceramics. The piezoelectric plate 16 is polarized along arrow P, i.e., in a direction parallel to the major surfaces. Further, first and second resonance electrodes 17 and 18 are formed on both major surfaces of the piezoelectric plate 16. The first resonance electrode 17 is formed on the upper surface of the piezoelectric plate 16 to extend from one end toward a central region. On the other hand, the second resonance electrode 18 is formed on the lower surface of the piezoelectric plate 16 to extend from another end to the central region. Numerals 19a and 19b denote lead electrodes.

The first and second resonance electrodes 17 and 18 are arranged to be opposed to each other through the piezoelectric plate 16 in its central region, so that the opposed portions of the resonance electrodes 17 and 18 define an energy-trap resonance part. When an ac voltage is applied across the resonance electrodes 17 and 18, the resonance part is excited in a shear mode so that vibrational energy is trapped in the resonance part.

The resonance frequency of the piezoelectric resonance element 12 is influenced by the thickness, the width and the length of the piezoelectric plate 16. In general, it is possible to increase the resonance frequency by reducing the thickness of the piezoelectric plate 16.

Referring to FIG. 4, first and second holding plates 13 and 14 are bonded to the piezoelectric plate 16 from above and below the piezoelectric resonance element 12. These holding plates 13 and 14 are adapted to reinforce the piezoelectric resonance element 12. Therefore, the holding plates 13 and 14 can be made of a proper material such as dielectric ceramics, piezoelectric ceramics, a glass epoxy composite material or synthetic resin, for example, so far as the same can attain reinforcing effects.

However, the holding plates 13 and 14 are preferably made of a material having a thermal expansion coefficient which is close to that of the material forming the piezoelectric plate 16, since the same are integrated with the piezoelectric resonance element 12 by the adhesive layers 15a to 15d.

Figure 5:
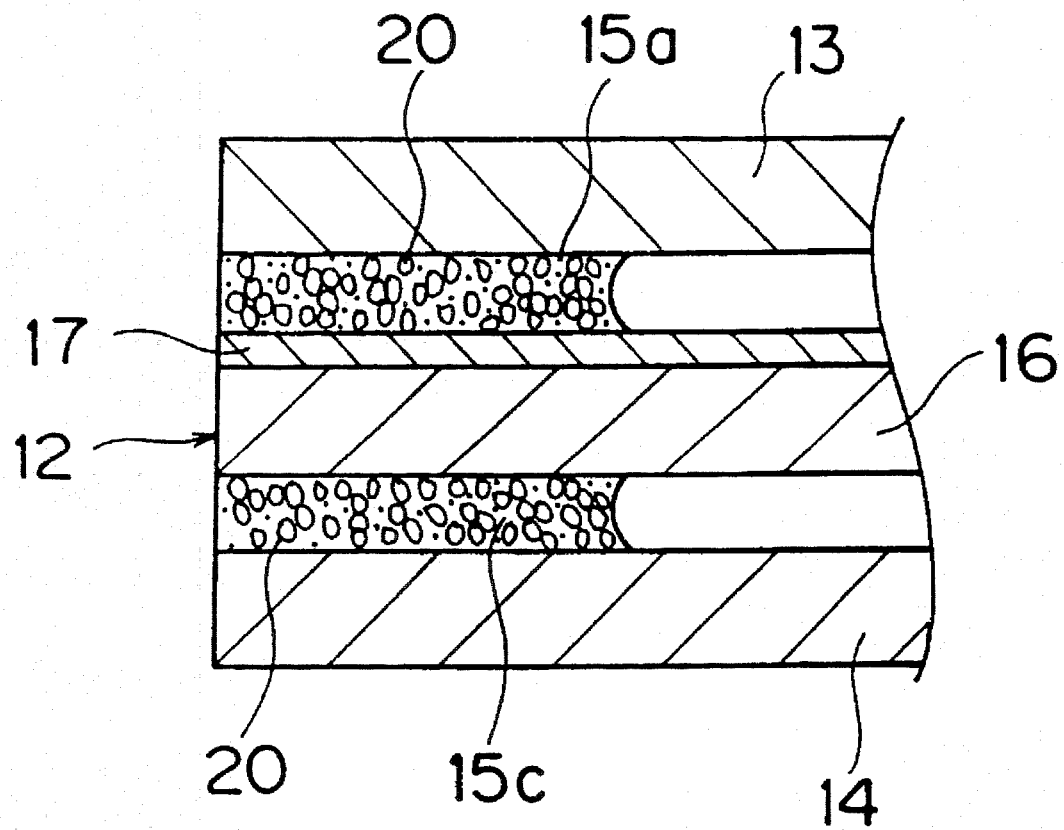
FIG. 5 is a partially enlarged sectional view for illustrating the principal part of the piezo-resonator according to the first embodiment of the present invention.

The feature of the piezo-resonator 11 according to this embodiment resides in that spaces for allowing vibration of the resonance part of the piezoelectric resonance element 12 are ensured by the adhesive layers 15a and 15d, while the adhesive layers 15a to 15d contain granular solids for reliably ensuring the spaces. As shown in FIG. 5 in a partially enlarged sectional view, the adhesive layers 15a and 15c contain granular solids 20. The granular solids 20 are made of a suitable material such as ceramic powder, metal powder or synthetic resin powder. Due to the granular solids 20, the adhesive layers 15a and 15c can be ensured in thicknesses which are sufficient for ensuring the vibration spaces even if pressure is applied onto the holding plates 13 and 14 which are bonded to the piezoelectric resonance element 12.

Thus, it is possible to reliably define the spaces for allowing vibration of the resonance part of the piezo-resonator 11 by the adhesive layers 15a to 15d in high accuracy.

In the piezo-resonator 11 according to this embodiment, the piezoelectric resonance element 12 is integrated with the holding plates 13 and 14 by the adhesive layers 15a to 15d, to be reinforced. Therefore, it is possible to reduce the thickness of the piezoelectric plate 16 forming the piezoelectric resonance element 12, thereby readily coping with high frequencies. Thus, it is possible to form the piezo-resonator 11 which can be employed at higher frequencies while maintaining the piezoelectric plate 16 in a constant length.

The adhesive for forming the adhesive layers 15a to 15d can be prepared from a proper material such as an epoxy-based adhesive or a silicon-based adhesive.

Figure 1:
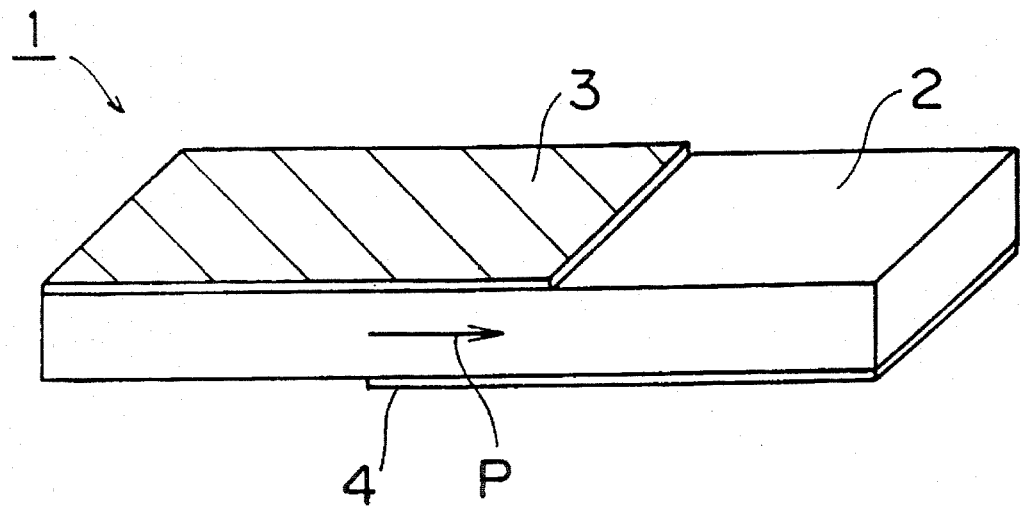
FIG. 1 is a perspective view showing a piezoelectric resonance element.
Figure 2:
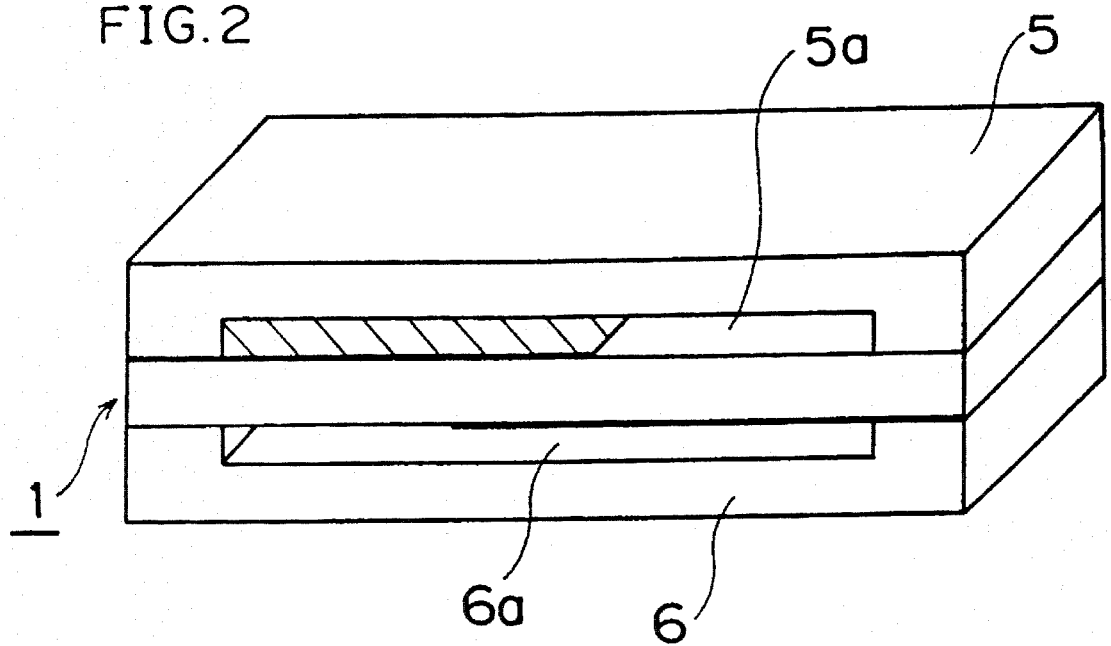
FIG. 2 is a perspective view showing a conventional piezo-resonator employing the piezoelectric resonance element shown in FIG. 1.

In addition, the holding plates 13 and 14 are simply formed by flat plate type members in the piezo-resonator 11 according to this embodiment. Thus, the holding plates 13 and 14 can also be obtained with requirement for neither performance of complicated machining nor preparation of a complicated form block. In order to obtain the protective substrates 5 and 6 shown in FIG. 2 by molding in order to ensure the vibration spaces for the resonance part, for example, it is necessary to prepare molds having protrusions of dimensions which are responsive to the cavities 5a and 6a. However, the dimensions of vibration spaces as required are varied with the frequencies. In order to obtain piezo-resonators of various frequencies, therefore, various types of molds are required for forming the cavities 5a and 6a in various dimensions.

On the other hand, it is possible to efficiently obtain the holding plates 13 and 14 by molding at a low cost, due to no requirement for formation of the aforementioned cavities. Further, the vibration spaces around the resonance part can be reliably ensured by simply changing the lengths X of the adhesive layers 15a to 15d shown in FIG. 4. While the dimensions of the vibration spaces are varied as hereinabove described when piezoelectric resonance elements 12 of various frequencies are employed, it is possible to reliably define the vibrating spaces for allowing vibration of the resonance part by simply changing the lengths X of the adhesive layers 15a to 15d according to this embodiment.

Figure 6:
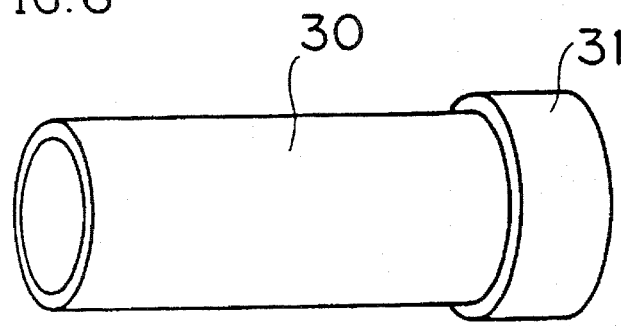
FIG. 6 is a perspective view showing an insulating cylinder and a metal cap for forming a chip-type component through the piezo-resonator according to the first embodiment of the present invention.

While the energy-trap piezo-resonator 11 according to this embodiment can be employed in the structure shown in FIG. 3 as such, it is also possible to form a chip-type piezo-resonator by fixing a metal cap 31 onto one end of a cylindrical insulating cylinder 30 for serving as an external electrode, inserting the energy-trap piezo-resonator 11 shown in FIG. 3 in the insulating cylinder 30, and fixing another metal cap which is similar to the metal cap 31 onto another end of the insulating cylinder 30, as shown in FIG. 6. In this case, the metal cap 31 and that fixed onto the other end of the insulating cylinder 30 are electrically connected to the aforementioned lead electrodes 19a and 19b respectively by a conductive adhesive or through soldering.

Also when this embodiment is applied to such a chip-type piezo-resonator, the length of the piezoelectric plate 16 in the piezo-resonator 11 can be standardized and hence it is possible to standardize the dimensions of the insulating cylinder 30 and the metal cap 31 as prepared.

Figure 7:
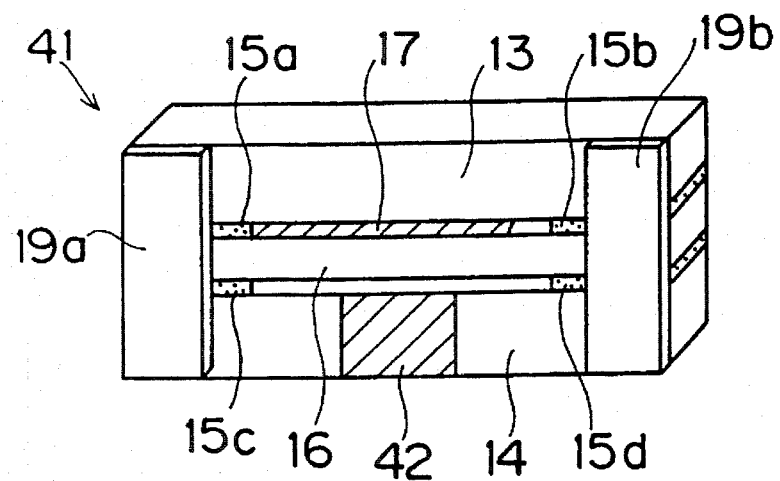
FIG. 7 is a perspective view showing an energy-trap piezo-resonator according to a modification of the first embodiment.

FIG. 7 is a perspective view showing an energy-trap piezo-resonator 41 according to a modification of the energy-trap piezo-resonator 11 shown in FIG. 3. In the energy-trap piezo-resonator 41 shown in FIG. 7, a holding plate 14 is provided on its side surface with an electrode 42 for deriving capacitance. Therefore, a capacitor is formed between the electrode 42 and lead electrodes 19a and 19b provided on both sides, whereby it is possible to form a three-terminal capacitive piezoelectric oscillator, with the lead electrodes 19a and 19b and the electrode 42 serving as connection ends with the exterior. The remaining points of this modification are similar to those of the first embodiment, and hence portions identical to those of the first embodiment are denoted by the same reference numerals, to omit redundant description.

Figure 8:
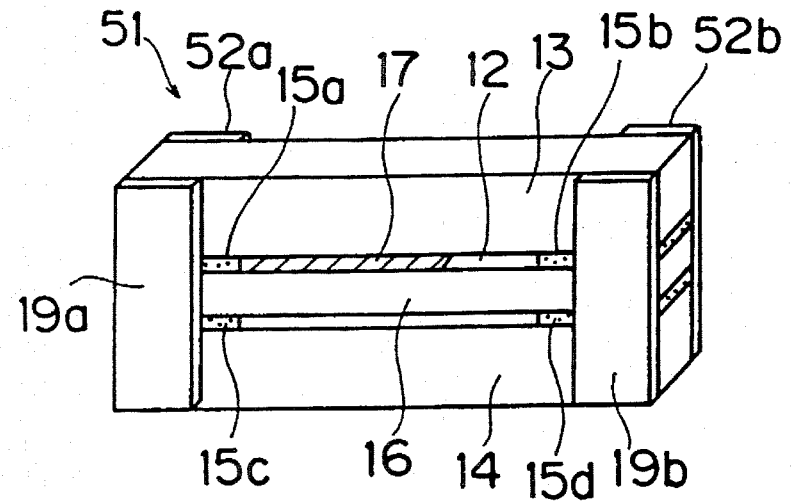
FIG. 8 is a perspective view showing another energy-trap piezo-resonator according to another modification of the first embodiment.

FIG. 8 shows a piezo-resonator 51 according to another modification of the first embodiment. As shown in FIG. 8, additional lead electrodes 52a and 52b may be formed on side surfaces which are opposite to those provided with lead electrodes 19a and 19b.

Also in each of the energy-trap piezo-resonators 41 and 51 shown in FIGS. 7 and 8, it is possible to reliably define spaces for allowing vibration of a resonance part since adhesive layers 15a to 15d contain granular solids similarly to the piezo-resonator 11 according to the first embodiment.

A chip-type piezoelectric resonance element according to a second embodiment of the present invention is now described with reference to FIGS. 9 and 10.

Figure 9:
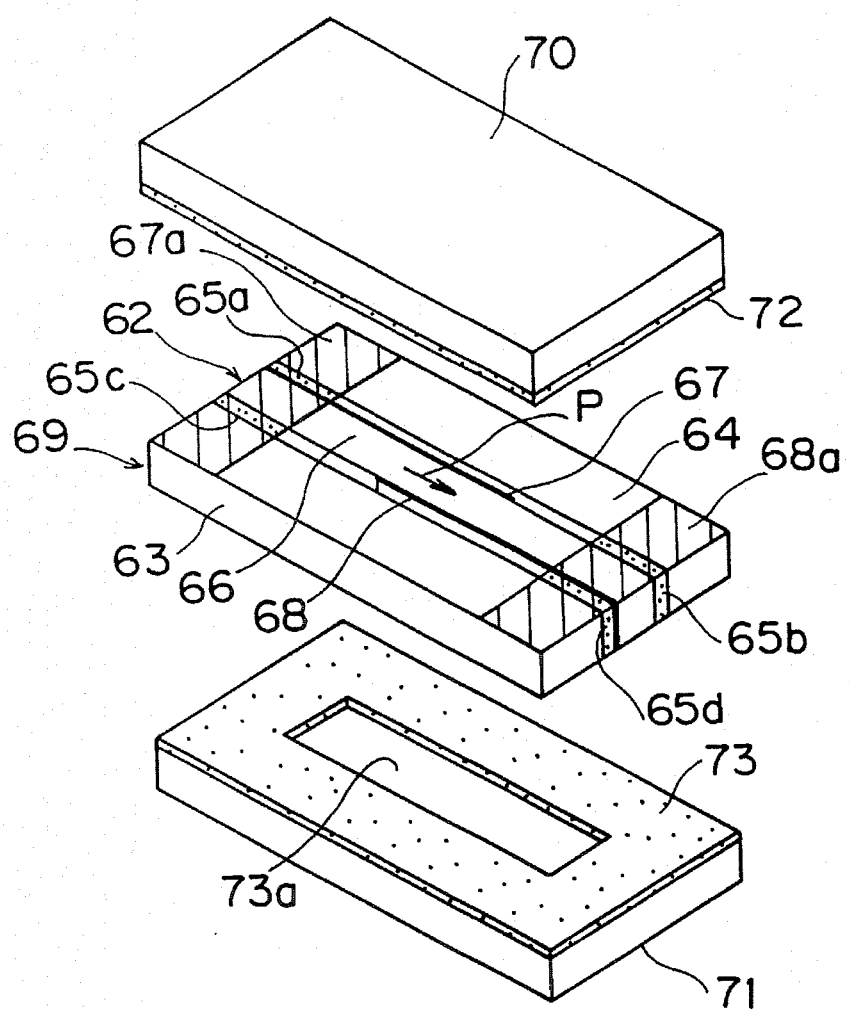
FIG. 9 is an exploded perspective view for illustrating a chip-type piezoelectric resonance component according to a second embodiment of the present invention.

As shown in FIG. 9, a piezoelectric resonance element 62 utilizing a thickness shear mode is employed in the chip-type piezoelectric resonance component according to this embodiment. Further, first and second holding plates 63 and 64 are bonded to a pair of opposite side surfaces of the piezoelectric resonance element 62 by adhesive layers 65a to 65d.

The piezoelectric resonance element 62 is an energy-trap piezoelectric resonance element utilizing a thickness shear mode, similarly to the piezoelectric resonance element 12 shown in FIG. 4. Namely, the piezoelectric resonance element 62 has a piezoelectric body 66 which is made of a piezoelectric material such as piezoelectric ceramics. The piezoelectric body 66 is polarized along arrow P, i.e., in a direction parallel to the pair of opposite side surfaces. Further, first and second resonance electrodes 67 and 68 are formed on a pair of side surfaces of the piezoelectric body 66. The first resonance electrode 67 is formed on one of the side surfaces of the piezoelectric body 66 to extend from one end to a central region thereof. On the other hand, the second resonance electrode 68 is formed on the other side surface of the piezoelectric body 66 to extend from another end to the central region thereof. These first and second resonance electrodes 67 and 68 are opposed to each other through the piezoelectric body 66 on the central region thereof. Thus, the opposed portions of the resonance electrodes 67 and 68 define an energy-trap resonance part. When an ac voltage is applied across the resonance electrodes 67 and 68, therefore, the resonance part is excited in a shear mode so that resonance energy is trapped in this resonance part.

First and second holding plates 63 and 64 are bonded to the piezoelectric body 66 from outside a pair of side surfaces of the piezoelectric resonance element 62. The holding plates 63 and 64 are adapted to reinforce the piezoelectric resonance element 62 similarly to the holding plates 13 and 14 shown in FIG. 4, and hence the same can be made of a material which is similar to that for the holding plates 13 and 14.

Similarly to the holding plates 13 and 14, further, the holding plates 63 and 64 are preferably made of a material having a thermal expansion coefficient which is close to that of the piezoelectric body 66.

Also in this embodiment, spaces for allowing vibration of the resonance part of the piezoelectric resonance element 62 are ensured by the adhesive layers 65a to 65d, which contain granular solids for reliably ensuring the spaces. Even if a pressure is applied in the bonding direction onto the holding plates 63 and 64 which are bonded to the piezoelectric resonance element 62, therefore, the adhesive layers 65a to 65d are provided in sufficient thicknesses for ensuring the vibration spaces.

Also in this embodiment, further, the piezoelectric resonance element 62 is reinforced by the holding plates 63 and 64, whereby it is possible to reduce the distance between the pair of side surfaces of the piezoelectric body 66, thereby readily coping with high frequencies. Thus, it is possible to form a piezoelectric resonance component 61 which can be employed at higher frequencies while maintaining the piezoelectric body 66 in a constant length.

The adhesive for forming the adhesive layers 65a to 65d can be prepared from that which is similar to the adhesive for forming the adhesive layers 15a to 15d.

According to this embodiment, the holding plates 63 and 64 are bonded to the side portions of the piezoelectric resonance element 62 as hereinabove described, to form a resonance plate 69.

Lead electrodes 67a and 68a are formed on an upper surface of the resonance plate 69, to reach outer peripheral edges of the resonance plate 69 respectively. Further, the lead electrodes 67a and 68a are electrically connected to the resonance electrodes 67 and 68 respectively.

Sealing substrates 70 and 71 as third and fourth holding plates for sealing the resonance part are bonded to upper and lower portions of the resonance plate 69. These sealing substrates 70 and 71 are bonded through adhesive layers 72 and 73 which are formed on lower and upper surfaces of the sealing substrates 70 and 71 respectively. The adhesive layer 73 has a rectangular opening portion 73a in its center, while the adhesive layer 72 also has a rectangular opening portion in its center. These rectangular opening portions are adapted to define spaces for allowing vibration of the resonance part of the piezoelectric resonance element 62 above and under this resonance part.

The adhesive layers 72 and 73 are also preferably prepared from a proper adhesive such as an epoxy-based adhesive or a silicon-based adhesive containing the aforementioned granular solids similarly to the adhesive layers 65a to 65d, so that it is possible to reliably define the spaces for allowing vibration above and under the resonance part.

However, the adhesive layers 72 and 73 may alternatively be made of an adhesive containing no granular solids.

Figure 10:
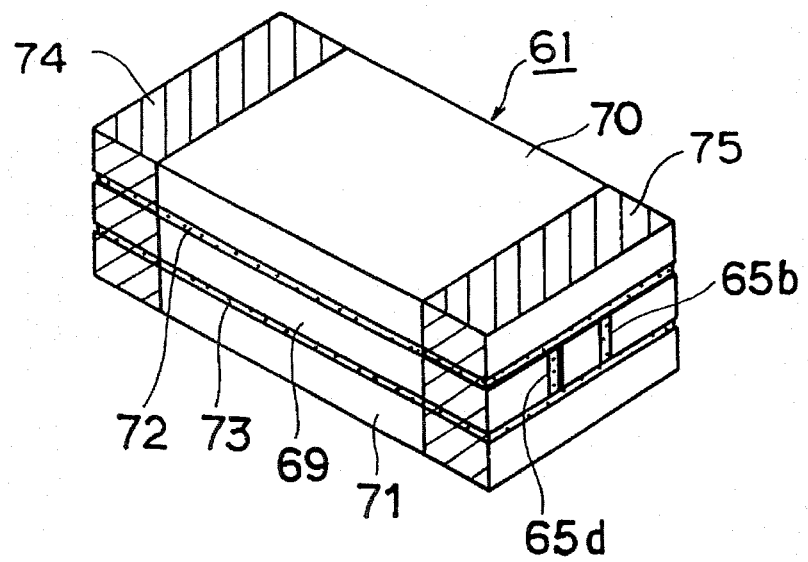
FIG. 10 is a perspective view for illustrating the chip-type piezoelectric resonance component according to the second embodiment of the present invention.

It is possible to obtain a chip-type piezoelectric resonance component 61 shown in FIG. 10 by bonding the sealing substrates 70 and 71 onto the resonance plate 69 and further properly forming external electrodes. In the chip-type piezoelectric resonance component 61, external electrodes 74 and 75 are formed on outer surfaces of a laminate which is formed by stacking the resonance plate 69 and the sealing substrates 70 and 71. The external electrode 74 is formed to be electrically connected to the lead electrode 67a, thereby being electrically connected to the resonance electrode 67. Similarly, the external electrode 75 is formed to be electrically connected to the other lead electrode 68a, and electrically connected to the resonance electrode 68 through the lead electrode 68a.

In the chip-type piezoelectric resonance component 61 shown in FIG. 10, the external electrodes 74 and 75 are formed to cover up outer peripheries of the laminate obtained in the aforementioned manner. Thus, the chip-type piezoelectric resonance component 61 can be surface-mounted on a wiring pattern which is provided on a printed circuit board, similarly to other chip-type electronic components.

Namely, the external electrodes 74 and 75 are formed to cover up the bottom surface, a pair of side surfaces and the upper surface of the chip-type piezoelectric resonance component 61.

Figure 11:
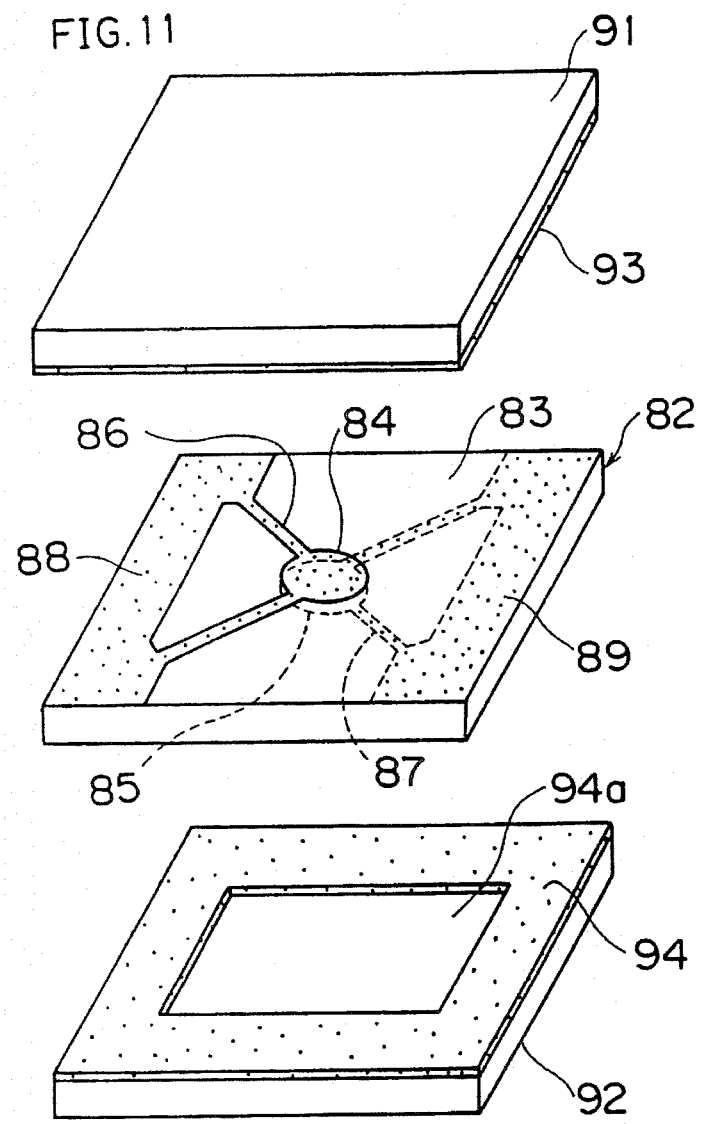
FIG. 11 is an exploded perspective view for illustrating a chip-type piezoelectric resonance component according to a third embodiment of the present invention.
Figure 12:
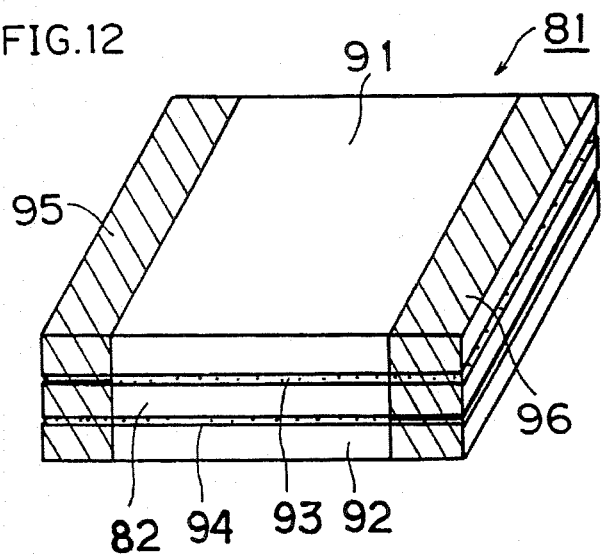
FIG. 12 is a perspective view showing the appearance of the chip-type piezoelectric resonance component according to the third embodiment of the present invention.

FIG. 11 is an exploded perspective view for illustrating a chip-type piezoelectric resonance component 81 according to a third embodiment of the present invention, and FIG. 12 is a perspective view showing the chip-type piezoelectric resonance component 81 according to the third embodiment.

Referring to FIG. 11, a piezo-resonator 82 utilizing a thickness expansion mode is employed in this embodiment. The piezo-resonator 82 is formed by a rectangular piezoelectric plate 83. A first resonance electrode 84 is formed on the center of an upper surface of the piezoelectric plate 83, while a second resonance electrode 85 is formed on the center of a lower surface to be opposed to the first resonance electrode 84 through the piezoelectric plate 83. The resonance electrodes 84 and 85 are electrically connected to lead electrodes 88 and 89 through connection conductive parts 86 and 87 respectively. The lead electrodes 88 and 89 are formed on upper and lower surfaces of the piezoelectric plate 83 respectively.

The piezoelectric plate 83 is polarized so that polarization axes are regularized along the thickness direction. When an ac voltage is applied across the resonance electrodes 84 and 85, therefore, the piezo-resonator 82 operates as an energy-trap piezo-resonator utilizing a thickness expansion mode.

According to this embodiment, sealing substrates 91 and 92 are bonded to the upper and lower surfaces of the piezo-resonator 82 respectively, for sealing a resonance part. These sealing substrates 91 and 92 are bonded by adhesive layers 93 and 94 respectively. The adhesive layer 94 has a rectangular opening portion 94a in its center, while the adhesive layer 93 also has a rectangular opening portion in its center. The rectangular openings are adapted to define spaces for allowing vibration of the resonance part, which is formed by opposition of the resonance electrodes 84 and 85, above and under the resonance part. Therefore, the opening portion 94a may not necessarily have a rectangular plane shape, but may have another shape such as a circular shape.

Also in this embodiment, the adhesive layers 93 and 94 are made of a material prepared by introducing the aforementioned granular solids into a proper adhesive such as a silicon-based adhesive or an epoxy-based adhesive. Even if the sealing substrates 91 and 92 which are bonded to upper and lower portions of the piezo-resonator 82 are pressurized along the thickness direction, therefore, it is possible to reliably define the spaces for allowing vibration above and under the resonance part.

According to this embodiment, the sealing substrates 91 and 92, which are provided to define the spaces for allowing vibration above and under the resonance part and sealing the same, are also adapted to reinforce the piezo-resonator 82.

Namely, the piezo-resonator 82 is reinforced by the sealing substrates 91 and 92 which are stacked thereon, whereby it is possible to reduce the thickness of the piezoelectric plate 83 forming the piezo-resonator 82, thereby readily coping with high frequencies.

Also in this embodiment, external electrodes 95 and 96 are formed on surfaces of the laminate as obtained as shown in FIG. 12, similarly to the second embodiment. The external electrodes 95 and 96 are formed so as to cover up the bottom surface, a pair of side surfaces and the upper surface of the laminate, so that these external electrodes 95 and 96 are electrically connected to the lead electrodes 88 and 89 respectively.

Also in this embodiment, the external electrodes 95 and 96 are formed on the outer surfaces of the laminate, whereby the chip-type piezoelectric resonance component 81 according to this embodiment can be surface-mounted on a wiring pattern provided on a printed circuit board.

As clearly understood from the embodiment described with reference to FIGS. 11 and 12, it is also possible to employ a piezoelectric resonance element utilizing a thickness expansion mode according to the present invention.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An energy-trap chip-type piezoelectric resonance component comprising:
   an energy-trap piezoelectric resonance element having a piezoelectric body and first and second resonance electrodes being partially formed on a pair of opposite surfaces of said piezoelectric body;
   first and second holding plates each being arranged to hold said piezoelectric resonance element from both said pair of opposite surfaces of said piezoelectric body, wherein at least one of said first and second holding plates comprises a substantially flat plate having no recesses formed therein; and
   adhesive layers bonding said piezoelectric resonance element and said first and second holding plates with each other in regions other than a resonance part for allowing vibration of said resonance part and integrating said piezoelectric resonance element with said first and second holding plates;
   said adhesive layers containing granular solids, each of said adhesive layers having a thickness defining a vibration space between said first holding plate and said resonance part or between said second holding plate and said resonance part so as to allow said resonance part to vibrate uninhibited, the thickness of each adhesive layer being substantially equal to a distance between said first holding plate and said resonance plate or between said second holding plate and said resonance plate, said granular solids being arranged to extend along the thickness of each of the adhesive layers.

2. The chip-type piezoelectric resonance component in accordance with claim 1, wherein grain sizes of said granular solids are in the range of 3 to 10 μm.

3. The chip-type piezoelectric resonance component in accordance with claim 1, wherein said piezoelectric body is a piezoelectric plate, said pair of opposite surfaces being both major surfaces of said piezoelectric plate.

4. The chip-type piezoelectric resonance component in accordance with claim 3, further comprising first and second lead electrodes being electrically connected with said first and second resonance electrodes and provided on outer surfaces of a structural body being formed by bonding said piezoelectric body with said first and second holding plates.

5. The chip-type piezoelectric resonance component in accordance with claim 4, wherein said first and second lead electrodes are formed as external electrodes of said chip-type piezoelectric resonance component.

6. The chip-type piezoelectric resonance component in accordance with claim 4, further comprising an insulating cylinder, and metal caps being fixed to both ends of said insulating cylinder for serving as external electrodes, a structure formed by bonding said piezoelectric resonance element with the first and second holding plates being inserted in said insulating cylinder.

7. The chip-type piezoelectric resonance component in accordance with claim 6, wherein said first and second lead electrodes are electrically connected to said metal caps being fixed to said both ends of said insulating cylinder respectively.

8. The chip-type piezoelectric resonance component in accordance with claim 4, further comprising a capacitance deriving electrode being formed at least on one of said first and second holding plates, a capacitor being formed by said capacitance deriving electrode and at least one of said first and second lead electrodes.

9. The chip-type piezoelectric resonance component in accordance with claim 1, wherein said piezoelectric resonance element is that utilizing a thickness shear mode.

10. The chip-type piezoelectric resonance component in accordance with claim 1, wherein said pair of opposite surfaces of said piezoelectric body are located on a pair of side surfaces of said piezoelectric body, said first and second resonance electrodes being formed on said pair of side surfaces respectively,
    said chip-type piezoelectric resonance component further comprising:
    third and fourth holding plates being stacked on upper and lower surfaces respectively of a bonded structure of said first and second holding plates and said piezoelectric resonance element, and
    second adhesive layers for bonding said third and fourth holding plates to upper and lower portions of said bonded structure of said piezoelectric resonance element and said first and second holding plates.

11. The chip-type piezoelectric resonance component in accordance with claim 10, wherein said second adhesive layers contain granular solids.

12. The chip-type piezoelectric resonance component in accordance with claim 10, further comprising first and second lead electrodes being formed on at least one major surface of the bonded structure and electrically connected to said first and second resonance electrodes.

13. The chip-type piezoelectric resonance component in accordance with claim 12, further comprising a pair of external electrodes being formed on its outer surfaces, said pair of external electrodes being electrically connected to said first and second lead electrodes.

14. The chip-type piezoelectric resonance component in accordance with claim 13, wherein said second adhesive layers have opening portions in centers thereof, spaces for allowing vibration of said resonance part being defined by said opening portions.

15. The chip-type piezoelectric resonance component in accordance with claim 10, wherein said piezoelectric resonance element is that utilizing a thickness shear mode.

16. The chip-type piezoelectric resonance component in accordance with claim 4, wherein said piezoelectric resonance element is that utilizing a thickness expansion mode.

17. The chip-type piezoelectric resonance component in accordance with claim 16, further comprising first and second external electrodes being formed on outer surfaces of a structure obtained by bonding said piezoelectric resonance element with said first and second holding plates, said first and second external electrodes being electrically connected to said first and second lead electrodes.

18. The chip-type piezoelectric resonance component in accordance with claim 17, wherein said piezoelectric plate is polarized in the thickness direction.

19. The chip-type piezoelectric resonance component in accordance with claim 2, wherein said piezoelectric resonance element is that utilizing a thickness shear mode.

20. The chip-type piezoelectric resonance component in accordance with claim 3, wherein said piezoelectric resonance element is that utilizing a thickness shear mode.

21. The chip-type piezoelectric resonance component in accordance with claim 4, wherein said piezoelectric resonance element is that utilizing a thickness shear mode.

22. The chip-type piezoelectric resonance component in accordance with claim 5, wherein said piezoelectric resonance element is that utilizing a thickness shear mode.

23. The chip-type piezoelectric resonance component in accordance with claim 6, wherein said piezoelectric resonance element is that utilizing a thickness shear mode.

24. The chip-type piezoelectric resonance component in accordance with claim 7, wherein said piezoelectric resonance element is that utilizing a thickness shear mode.

25. The chip-type piezoelectric resonance component in accordance with claim 8, wherein said piezoelectric resonance element is that utilizing a thickness shear mode.

26. The energy-trap chip-type piezoelectric resonance component of claim 1, wherein said adhesive layers define a first space between said piezoelectric resonance element and said first holding plate and a second space between said piezoelectric resonance element and said second holding plate.

27. An energy-trap chip-type piezoelectric resonance component comprising:

an energy-trap piezoelectric resonance element having a piezoelectric body and first and second resonance electrodes being partially located on a pair of opposite side surfaces of said piezoelectric body, said piezoelectric body having top and bottom surfaces connected by said pair of opposite side surfaces;

first and second holding plates each being connected to one of said opposite side surfaces of said piezoelectric body to hold said piezoelectric resonance element on said opposite side surfaces thereof;

third and fourth holding plates each being connected to one of the top and bottom surfaces of said piezoelectric body to hold said piezoelectric resonance element on said top and bottom surfaces thereof;

first adhesive layers bonding said piezoelectric resonance element and said first and second holding plates with each other in regions other than a resonance part for allowing vibration of said resonance part and integrating said piezoelectric resonance element with said first and second holding plates;

second adhesive layers bonding said piezoelectric resonance element and said third and fourth holding plates with each other in regions other than a resonance part for allowing vibration of said resonance part and integrating said piezoelectric resonance element with said third and fourth holding plates.

28. The energy-trap chip-type piezoelectric resonance component of claim 27, wherein at least one of the first and second adhesive layers comprises granular solids.

29. The energy-trap chip-type piezoelectric resonance component of claim 27, wherein at least one of said third and fourth holding plates comprises a substantially flat plate.

30. The energy-trap chip-type piezoelectric resonance component of claim 27, wherein each of the second adhesive layers is arranged to form a continuous layer on the respective third and fourth holding plates so as to define a space between the piezoelectric resonance element and the respective third and fourth holding plates.

* * * * *